US010672785B2

(12) United States Patent
Simsek-Ege et al.

(10) Patent No.: US 10,672,785 B2
(45) Date of Patent: Jun. 2, 2020

(54) INTEGRATED STRUCTURES OF VERTICALLY-STACKED MEMORY CELLS

(71) Applicant: Micron Technology, Inc., Boise, ID (US)

(72) Inventors: Fatma Arzum Simsek-Ege, Boise, ID (US); Meng-Wei Kuo, Boise, ID (US); John D. Hopkins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/679,926

(22) Filed: Apr. 6, 2015

(65) Prior Publication Data
US 2016/0293623 A1 Oct. 6, 2016

(51) Int. Cl.
| H01L 27/11556 | (2017.01) |
| H01L 27/11582 | (2017.01) |
| H01L 21/311 | (2006.01) |
| H01L 21/3213 | (2006.01) |
| H01L 21/28 | (2006.01) |
| H01L 27/11524 | (2017.01) |
| H01L 27/1157 | (2017.01) |

(52) U.S. Cl.
CPC ... H01L 27/11582 (2013.01); H01L 21/31111 (2013.01); H01L 21/32134 (2013.01); H01L 27/1157 (2013.01); H01L 27/11524 (2013.01); H01L 27/11556 (2013.01); H01L 29/40114 (2019.08); H01L 29/40117 (2019.08)

(58) Field of Classification Search
CPC ............... H01L 27/11578; H01L 27/11556
USPC ........................................ 257/314
See application file for complete search history.

(56) References Cited

U.S. PATENT DOCUMENTS

2009/0321813 A1* 12/2009 Kidoh ............... H01L 29/42348
257/324
2014/0264532 A1 9/2014 Dennison et al.
2014/0339621 A1* 11/2014 Simsek-Ege ...... H01L 29/66825
257/316

* cited by examiner

*Primary Examiner* — Hsin Yi Hsieh
(74) *Attorney, Agent, or Firm* — Wells St. John P.S.

(57) ABSTRACT

Some embodiments include a method of forming vertically-stacked memory cells. An opening is formed through a stack of alternating insulative and conductive levels. Cavities are formed to extend into the conductive levels. Regions of the insulative levels remain as ledges which separate adjacent cavities from one another. Material is removed from the ledges to thin the ledges, and then charge-blocking dielectric and charge-storage structures are formed within the cavities. Some embodiments include an integrated structure having a stack of alternating insulative levels and conductive levels. Cavities extend into the conductive levels. Ledges of the insulative levels separate adjacent cavities from one another. The ledges are thinned relative to regions of the insulative levels not encompassed by the ledges. Charge-blocking dielectric and charge-storage structures are within the cavities.

9 Claims, 8 Drawing Sheets

INTEGRATED STRUCTURES OF VERTICALLY-STACKED MEMORY CELLS

TECHNICAL FIELD

Integrated structures and methods of forming vertically-stacked memory cells.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells. It is desired to develop improved NAND architecture, and improved methods of forming NAND architecture.

DETAILED DESCRIPTION OF THE ILLUSTRATED EMBODIMENTS

In some embodiments, NAND memory comprises vertically-stacked memory cells. The memory cells are formed within recesses (i.e., cavities), and such recesses are sculpted to improve the configuration of the memory cells. Example embodiments are described with reference to FIGS. 1-8.

Figure 1:
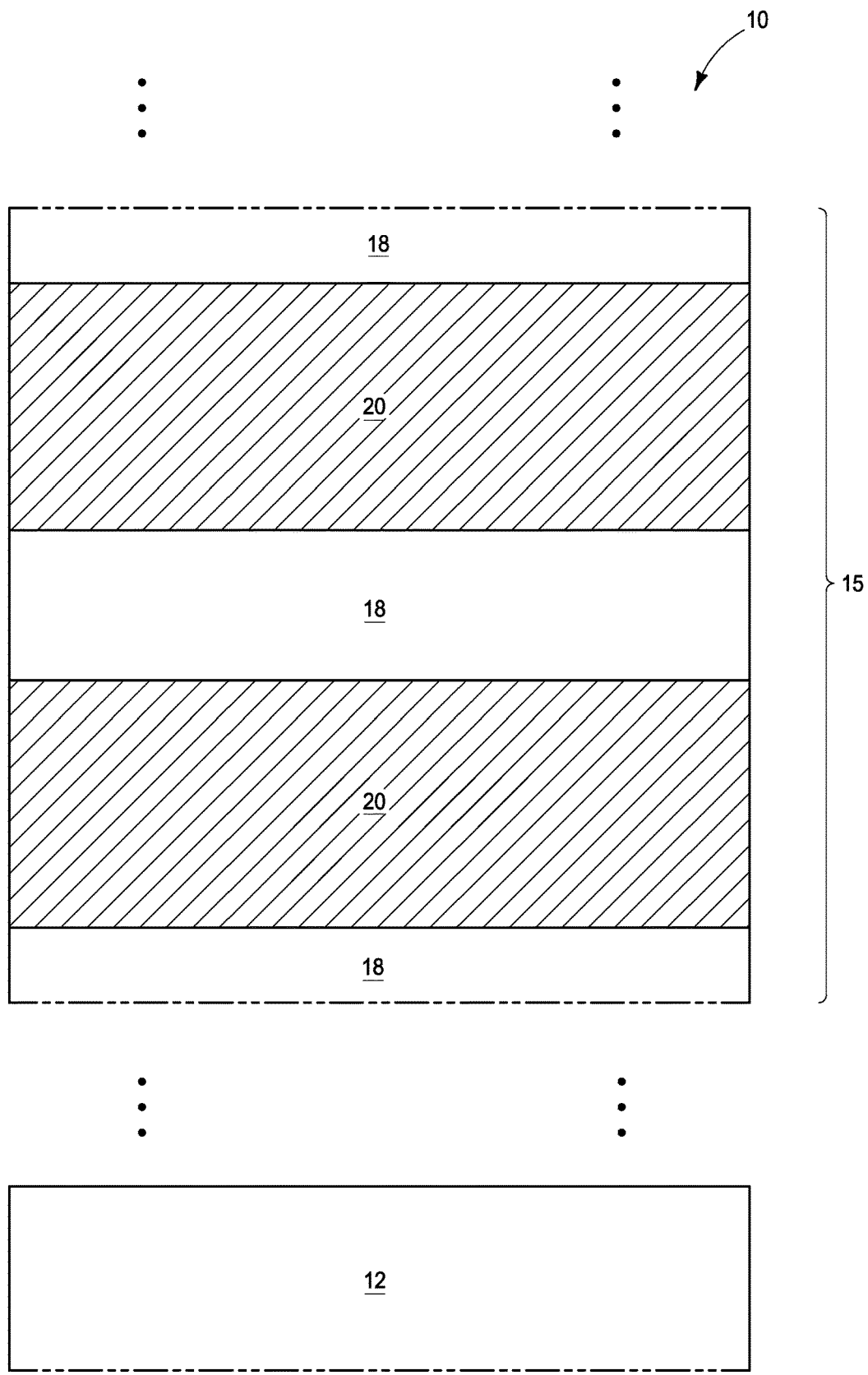
FIGS. 1-8 are cross-sectional views of a semiconductor construction at process stages of an example embodiment method of forming integrated structures.

Referring to FIG. 1, a semiconductor construction 10 is shown to comprise a stack 15 of alternating first and second levels 18 and 20. The levels 18 may be electrically insulative, and the levels 20 may be electrically conductive. The electrically conductive levels 20 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the electrically conductive levels 20 may comprise, consist essentially of, or consist of n-type doped polycrystalline silicon (i.e., n-type doped polysilicon).

The electrically insulative levels 18 may comprise any suitable composition or combination of compositions; and may, for example, comprise, consist essentially of, or consist of silicon dioxide.

The levels 18 and 20 may be of any suitable thicknesses; and may, for example, have thicknesses within a range of from about 10 nanometers (nm) to about 300 nm. In some applications, the levels 18 may have thicknesses within a range of from about 10 nm to about 60 nm, and levels 20 may have thicknesses within a range of from about 20 nm to about 40 nm.

The electrically conductive levels 20 may be utilized to pattern control gates of flash devices. In such applications, a vertical string of memory cells (such as, for example, a vertical NAND string of memory cells) may be fabricated, with the number of memory cells in each string being determined by the number of electrically conductive levels 20. The stack may comprise any suitable number of electrically conductive levels. For instance, the stack may have 8 electrically conductive levels, 16 electrically conductive levels, 32 electrically conductive levels, 64 electrically conductive levels, etc.

The stack is supported by a base 12. A break is provided between the stack 15 and the base 12 to indicate that there may be additional materials and/or integrated circuit structures between the base and the stack 15.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

There may be other materials and structures over the shown region of stack 15.

Figure 2:
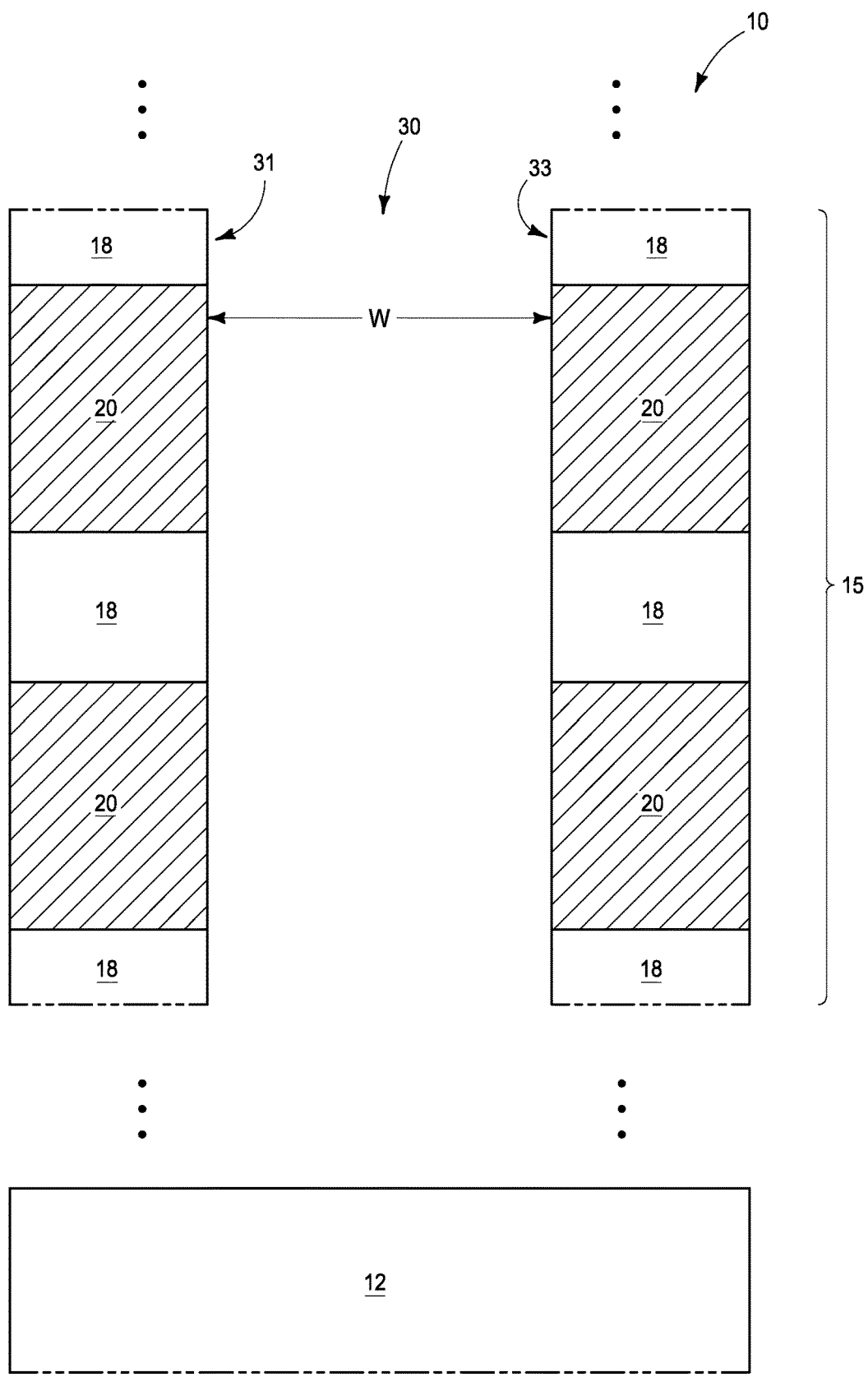

Referring to FIG. 2, an opening 30 is formed to extend through the stack 15. The opening may be formed with any suitable processing. For instance, in some embodiments patterned masking materials (not shown) may be provided over stack 15 to define a location of opening 30, and then the opening may be extended through the stack 15 with one or more suitable etches.

Opening 30 may have any suitable dimension and shape. In some embodiments, opening 30 may have a critical dimension (CD) within a range of from about 40 nm to about 100 nm; and accordingly may have a width "W" along the cross-section of FIG. 2 within a range of from about 40 nm to about 100 nm. The opening may be circular, rectangular, elliptical, etc. when viewed from above.

The illustrated opening 30 may be one of many openings which are simultaneously formed through stack 15 to fabricate a memory array.

The opening 30 has sidewalls 31 and 33 which extend along the insulative and conductive levels 18 and 20.

The formation of opening 30 may leave one or more undesired materials (not shown) along the sidewall surfaces. Example materials may be polymeric byproduct materials resulting from the etching conditions utilized to form opening 30, native oxide formed along silicon of conductive levels 20, etc. Such undesired materials may be removed with one or more cleaning etches. For instance, a so-called decap etch may be utilized to remove native oxide. The decap etch may utilize hydrofluoric acid and/or other suitable components.

Figure 3:
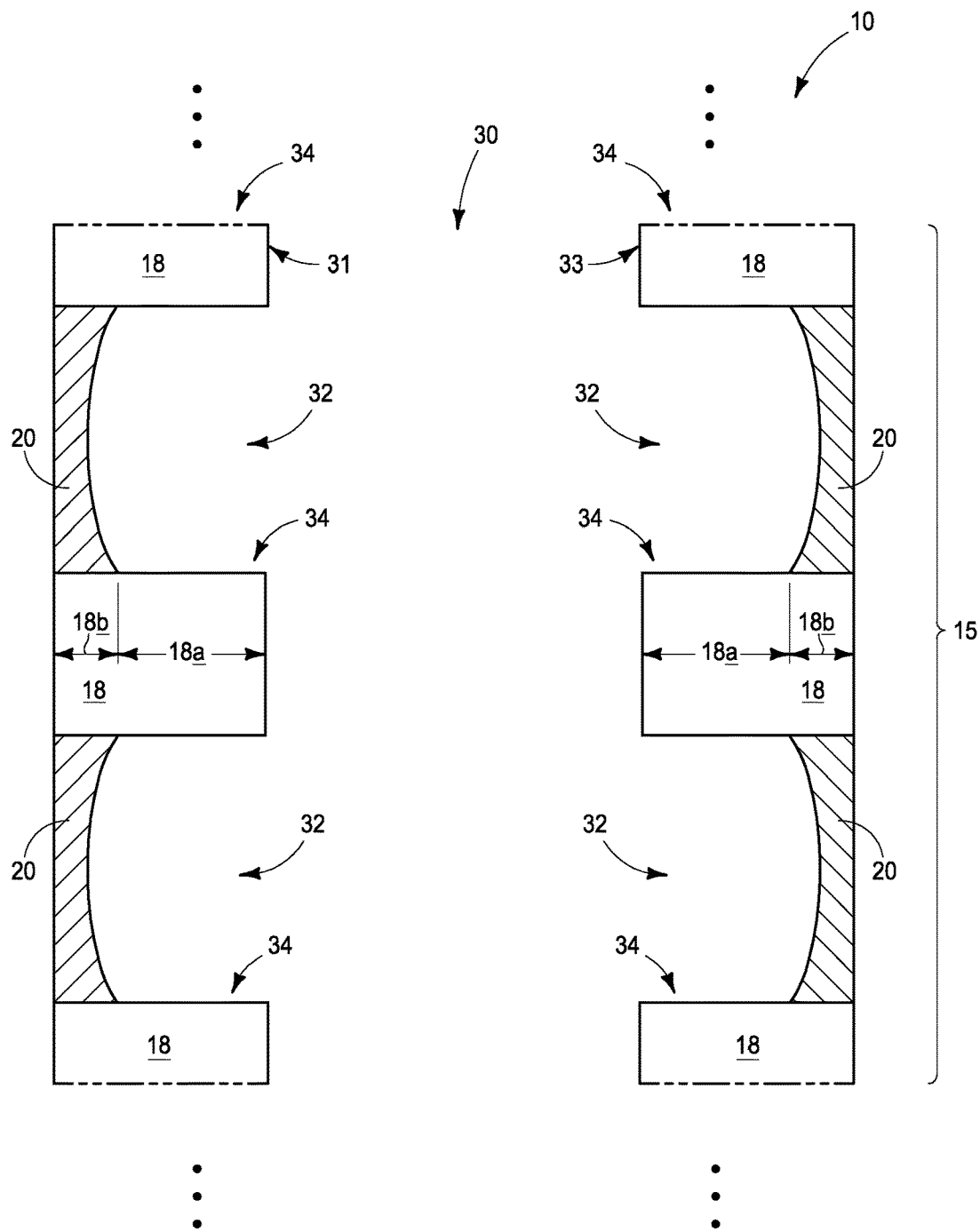
Figure 3:
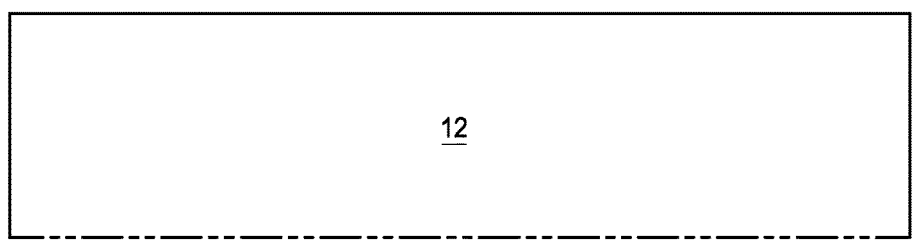

Referring to FIG. 3, cavities (i.e., recesses) 32 are formed into the conductive levels 20 along the sidewalls of opening 30. The cavities may be formed with any conditions suitable for selective removal of the conductive material 20 relative to the insulative material 18. The term "selective" is utilized to indicate that the etching conditions remove material 20 faster than insulative material 18. Such may include, but is not limited to, etching conditions which are 100% selective for material 20 relative to material 18.

In embodiments in which the levels 20 comprise conductively-doped silicon and the levels 18 comprise silicon dioxide, the cavities may be formed utilizing tetramethylammonium hydroxide (TMAH).

Regions of insulative levels 18 remaining between cavities 32 become ledges 34 which vertically separate adjacent cavities 32 from one another. In some embodiments, the insulative levels 18 at the processing stage of FIG. 3 may be considered to be subdivided into two regions 18a and 18b (only some of which are labeled), with regions 18a corresponding to the ledges 34, and regions 18b not corresponding to the ledges.

Figure 4:
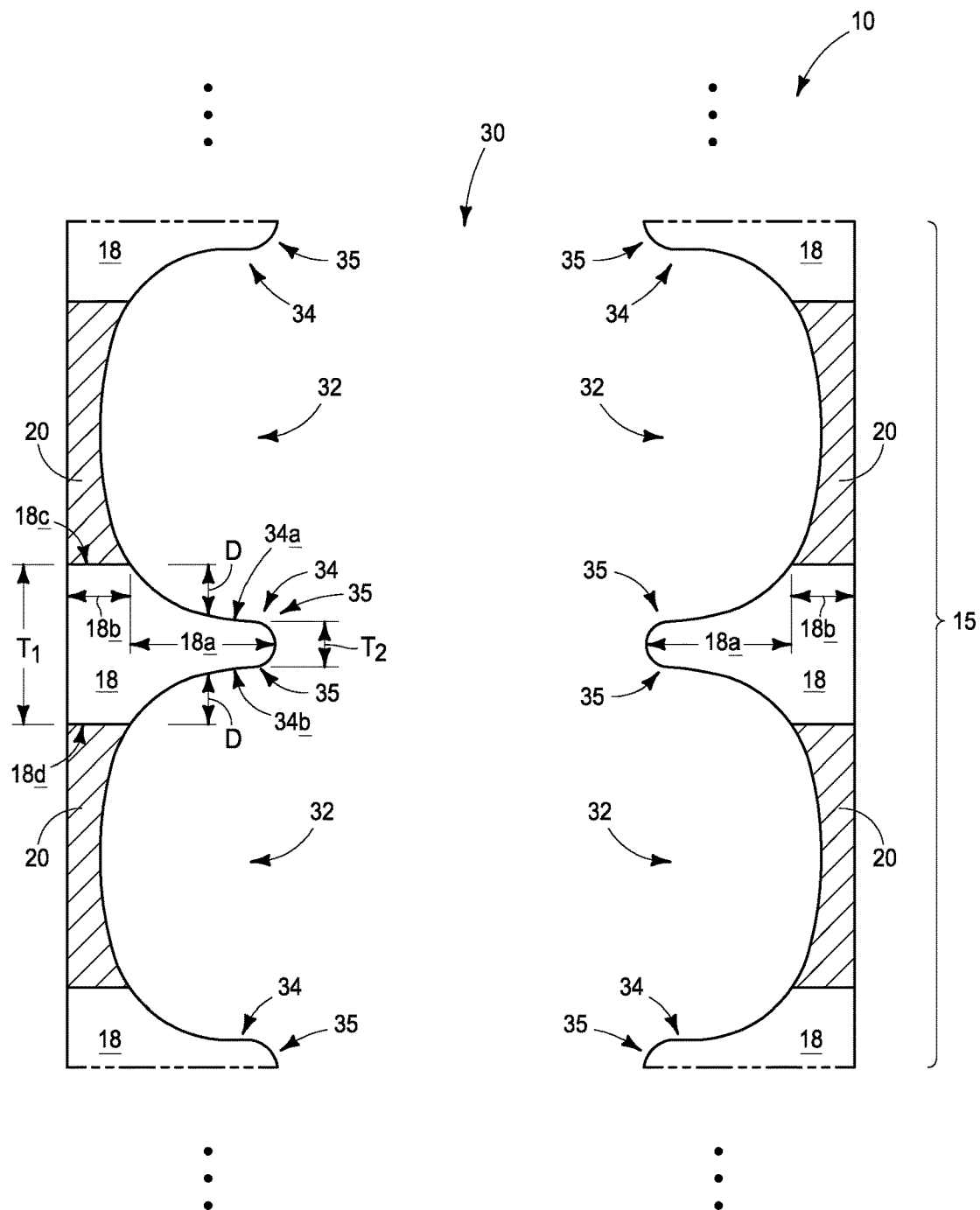

Referring to FIG. 4, insulative material 18 is removed from the ledges 34 to thin the ledges, and in the shown embodiment such also rounds outer corners of the ledges. Example rounded outer corners are labeled as regions 35 in FIG. 4.

The insulative material 18 may be removed from ledges 34 with any suitable processing, and preferably is removed with an etch selective for insulative material 18 relative to conductive material 20. For instance, in embodiments in which insulative material 18 comprises, consists essentially of, or consists of silicon dioxide, such material may be removed from the ledges with an etch utilizing hydrofluoric acid. The hydrofluoric acid may be present within an etching solution, and to a concentration within a range of from about 0.05 weight percent to about 1 weight percent.

The ledges 34 may be thinned to any suitable dimension. The non-ledge regions 18a of insulative material 18 are shown to have a first thickness $T_1$, and the ledge regions 18b are shown to have a second thickness $T_2$. The second thickness may be, for example, from about 50% to about 90% of the first thickness; or in other words, in some embodiments the thinning of ledges 34 may reduce the thicknesses of the ledges by an amount within a range of from about 10% to about 50%. In some embodiments, the thickness $T_1$ of the non-ledge regions 18b may be within a range of from about 20 nm to about 40 nm, and the thinned ledge regions 18a may have thicknesses $T_2$ within a range of from about 10 nm to about 15 nm.

In some embodiments, the thinned ledge regions 18a may be considered to have top and bottom surfaces 34a and 34b, and the non-ledge regions 18b may be considered to have top and bottom surfaces 18c and 18d. The top and bottom surfaces 34a and 34b of the ledge regions 18a are inset relative to the top and bottom surfaces 18c and 18d of the non-ledge regions 18b by distances "D". In some embodiments, such distances may be within a range of from about 2 nm to about 7 nm.

The processing of FIG. 4 may be considered to sculpt shapes of cavities 32 to improve such shapes for subsequent fabrication of charge-blocking materials and charge-storage materials.

Figure 5:
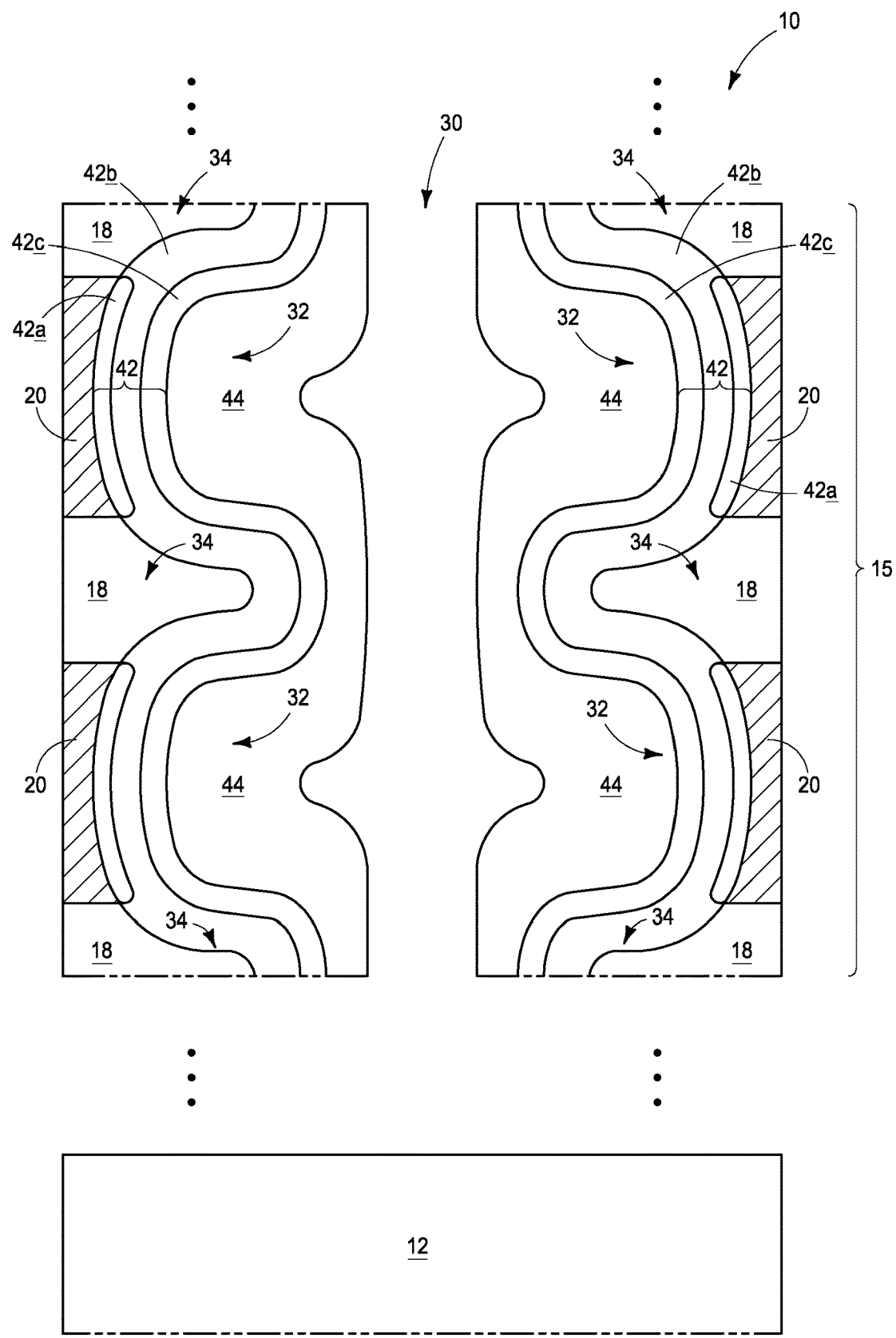

Referring to FIG. 5, charge-blocking dielectric 42 is formed within cavities 32. The charge-blocking dielectric may comprise any suitable composition or combination of compositions; and in some embodiments may comprise one or more of silicon nitride, silicon dioxide, hafnium oxide, zirconium oxide, etc. For instance, in the shown embodiment the charge-blocking dielectric 42 comprises three regions 42a, 42b and 42c, which may correspond to silicon dioxide, silicon nitride and oxide, respectively. The regions 42a, 42b and 42c may be referred to as first, second and third regions, respectively.

In some embodiments, the first region 42a may comprise silicon dioxide formed by oxidizing an exposed surface of polysilicon-containing conductive levels 20. Such oxidation may utilize any suitable conditions, such as, for example, in situ steam generation (ISSG). The first region 42a of the charge-blocking material is entirely contained within cavities 32 in the shown embodiment.

In some embodiments, the second region 42b may comprise silicon nitride formed by chemical vapor deposition and/or atomic layer deposition. The second region 42b may be formed to any suitable thickness, and in some embodiments may be formed to a thickness comparable to the inset distances "D" of FIG. 4. Accordingly, in some embodiments the second region 42b may be formed to a thickness within a range of from about 2 nm to about 7 nm. The second region 42b of the charge-blocking material wraps around ledges 34 in addition to extending within cavities 32, in the shown embodiment.

In some embodiments, the third region 42c may comprise an oxide formed by oxidation of a surface of the second region 42b. Accordingly, if second region 42b comprises silicon nitride, then third region 42c may comprise silicon oxynitride. The oxidation utilized to form third region 42c may utilize any suitable conditions, such as, for example, ISSG. In some embodiments, third region 42c may be formed by deposition alternatively to, or in addition to, oxidation. For instance, in some embodiments the third region 42c may be formed by deposition of silicon dioxide utilizing tetraethylorthosilicate precursor.

Charge-storage material 44 is formed over the charge-blocking dielectric 42. In the shown embodiment, material 44 is formed to wrap around ledges 34 and extend within cavities 32. The charge-storage material 44 may comprise any suitable composition or combination of compositions; and in some embodiments may comprise floating gate material (for instance, doped or undoped silicon) or charge-trapping material (for instance, silicon nitride, metal dots, etc.).

Figure 6:
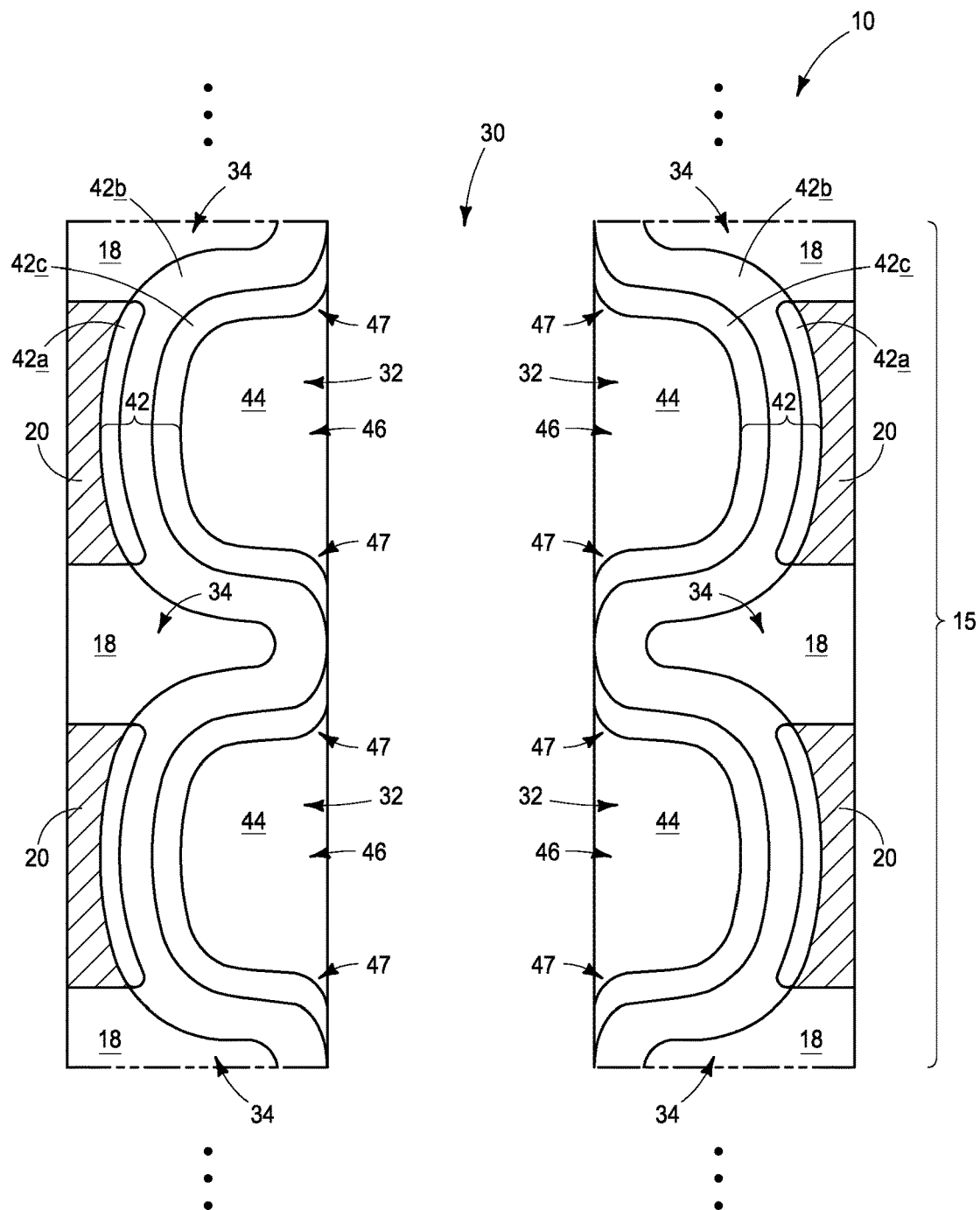
Figure 6:
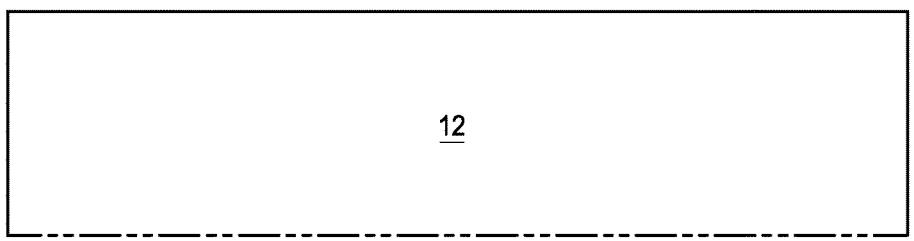

Referring to FIG. 6, etching is conducted to pattern floating gate material 44 into a plurality of spaced-apart structures 46 that extend within cavities 32. Such etching may utilize any suitable conditions, and in some example embodiments may utilize TMAH.

The structures 46 may be referred to as a preliminary charge-storage structures, in that they are a starting point toward charge-storage structures but do not have a desired final shape. Specifically, the structures 46 have sharp corners 47 (i.e., birdbeaks) along opening 30. Such sharp corners may detrimentally affect cell performance, and/or may lead to undesired cell-to-cell variability in performance characteristics.

Figure 7:
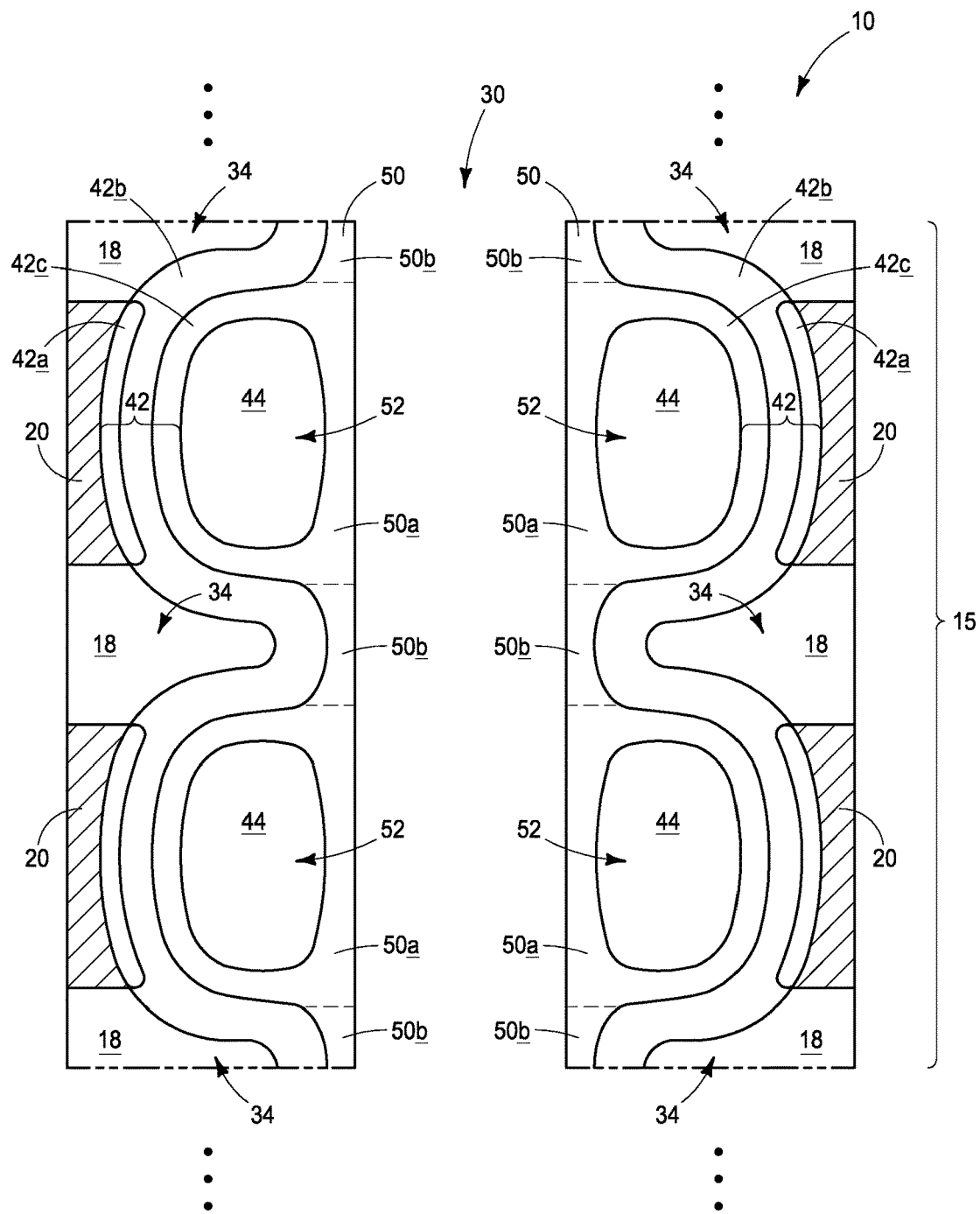
Figure 7:
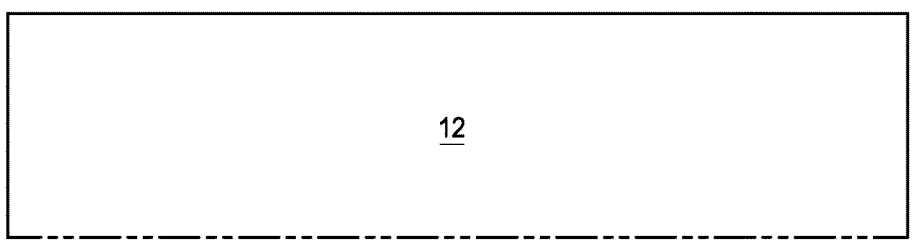

Referring to FIG. 7, gate dielectric 50 is formed along exposed edges of charge-storage material 44. The gate dielectric may be formed with any suitable processing, such as, for example, oxidation of exposed surfaces. The oxidation removes sharp corners 47 (FIG. 6) and accordingly transforms the preliminary charge-storage structures 46 (FIG. 6) into charge-storage structures 52 having a final, desired configuration. The oxidation may comprise any suitable conditions, and in some embodiments may utilize ISSG.

In the shown embodiment, the oxidation utilized to form gate dielectric also oxidizes exposed surfaces of charge-blocking dielectric region 42*b*. In embodiments in which region 42*b* comprises silicon nitride, such oxidation may form silicon oxynitride. Accordingly, dielectric 50 is shown subdivided into alternating regions 50*a* and 50*b*. The regions 50*a* may comprise, consist essentially of, or consist of silicon dioxide; and the regions 50*b* may comprise, consist essentially of, or consist of silicon oxynitride.

In the shown embodiment, regions 50*a* merge with charge-blocking dielectric region 42*c* since both regions 50*a* and 42*c* may comprise, consist essentially of, or consist of silicon dioxide.

Figure 8:
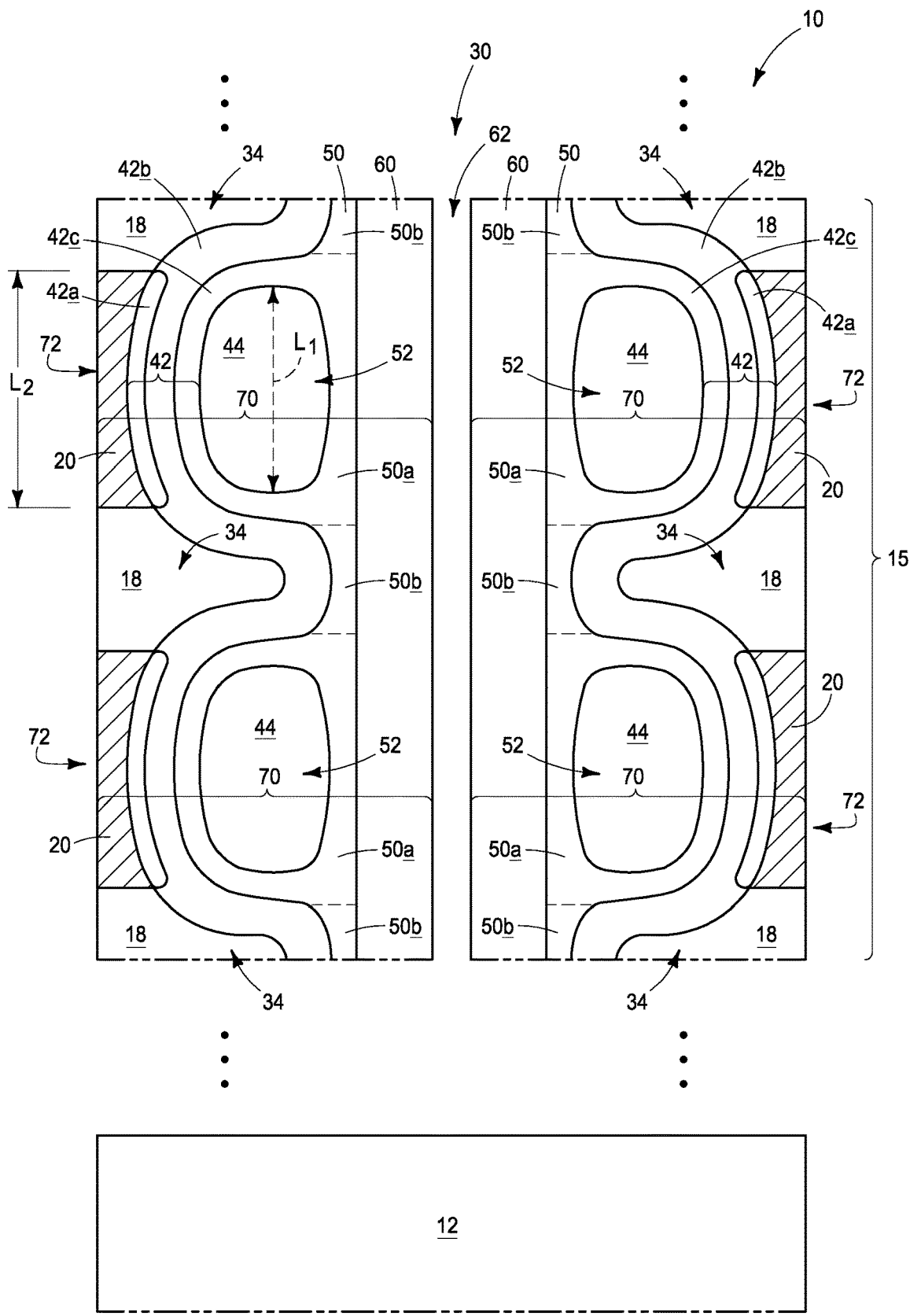

Referring to FIG. 8, channel material 60 is formed along the gate dielectric 50. The channel material may comprise any suitable composition or combination of compositions; and in some embodiments may comprise, consist essentially of, or consist of silicon. The channel material is shown to partially fill opening 30, and to thereby leave a remaining opening 62. Such is a hollow channel configuration, and in other embodiments the opening 30 may be entirely filled with channel material. Also, although opening 62 is shown to be empty, in other embodiments such opening may be filled with dielectric material, such as, for example, silicon dioxide.

Vertically-stacked memory cells 70 are formed by the various illustrated materials. Each memory cell comprises a charge-storage structure 52 and a control gate 72; with the control gates being comprised by regions of the conductive levels 20 adjacent the charge-storage structures.

The configuration of FIG. 8 advantageously comprises charge-storage structures 52 with continuous, curved outer peripheries; rather than having sharp corners. Also, the charge-blocking material 42 has a curved outer periphery, rather than having sharp corners. Avoidance of sharp corners along the outer peripheries of the charge-storage structures and the charge-blocking material can improve device performance relative to conventional devices, and may also improve cell-to-cell uniformity within a NAND array relative to conventional architectures.

The charge-storage structures 52 have illustrated gate lengths $L_1$, and the control gates 72 have illustrated control gate lengths $L_2$. It can be desired that lengths $L_1$ and $L_2$ be comparable to one another in order to achieve desired electrical overlap of device active areas during operation of the memory cells 70. In some embodiments, $L_1$ and $L_2$ may differ by less than 10 nm, or even by less than 5 nm, which can be advantageous relative to conventional configurations having greater differences between $L_1$ and $L_2$.

The architectures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming vertically-stacked memory cells. An opening is formed through a stack of alternating insulative and conductive levels. Cavities are formed to extend into the conductive levels along sidewalls of the opening. Regions of the insulative levels remain as ledges which separate adjacent cavities from one another. Material is removed from the ledges to thin the ledges. After the material is removed from the ledges, charge-blocking dielectric and charge-storage structures are formed within the cavities.

Some embodiments include a method of forming vertically-stacked memory cells. An opening is formed through a stack of alternating silicon dioxide levels and conductively-doped silicon levels. The opening has sidewalls along the silicon dioxide levels and along the conductively-doped silicon levels. Cavities are formed to extend into the conductively-doped silicon levels along the sidewalls of the opening. Regions of the silicon dioxide levels remain as ledges which separate adjacent cavities from one another. Silicon dioxide is removed from the ledges to thin the ledges. After the silicon dioxide is removed from the ledges, charge-blocking dielectric and charge-storage structures are formed within the cavities. Gate dielectric is formed along the charge-storage structures. Channel material is formed along the gate dielectric.

Some embodiments include a method of forming vertically-stacked memory cells. An opening is formed through a stack of alternating silicon dioxide levels and conductively-doped silicon levels. The opening has sidewalls along the silicon dioxide levels and along the conductively-doped silicon levels. Cavities are formed to extend into the conductively-doped silicon levels along the sidewalls of the opening. Regions of the silicon dioxide levels remain as ledges which separate adjacent cavities from one another. Silicon dioxide is removed from the ledges to thin the ledges and round corners of the ledges. After the silicon dioxide is removed from the ledges, charge-blocking dielectric and charge-storage structures are formed within the cavities. The charge-blocking dielectric comprises a first region containing silicon dioxide, a second region containing silicon nitride, and a third region containing oxide. The second region is between the first and third regions. The first region of the charge-blocking dielectric is entirely contained within the cavities, and the second region of the charge-blocking dielectric wraps around the ledges and extends into the cavities. Gate dielectric is formed along the charge-storage structures. Channel material is formed along the gate dielectric.

Some embodiments include an integrated structure comprising a stack of alternating silicon dioxide levels and conductively-doped silicon levels, cavities extending into the conductively-doped silicon levels, and ledges of the silicon dioxide levels separating adjacent cavities from one another. The ledges are thinned relative to regions of the silicon dioxide levels not encompassed by the ledges, and the ledges terminate in rounded corners. Charge-blocking dielectric and charge-storage structures are within the cavities. Gate dielectric is along the charge-storage structures. Channel material is along the gate dielectric.

Some embodiments include an integrated structure comprising a stack of alternating insulative levels and conductive levels. Cavities extend into the conductive levels. Ledges of the insulative levels separate adjacent cavities from one another. The ledges are thinned relative to regions of the insulative levels not encompassed by the ledges. Charge-blocking dielectric and charge-storage structures are within the cavities.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An integrated structure, comprising:
a stack of alternating silicon dioxide levels and conductively-doped silicon levels;
an opening extending through the stack, the opening having opening sidewalls along edges of the silicon dioxide levels;
edges of the conductively-doped silicon levels being laterally recessed relative to the edges of the silicon dioxide levels to define cavities located between the silicon dioxide levels; the cavities extending from the opening sidewalls into the conductively-doped silicon levels;
regions of the silicon dioxide levels over and under the cavities being ledges of the silicon dioxide levels separating adjacent cavities from one another; the ledges being thinned relative to regions of the silicon dioxide levels not encompassed by the ledges, each of the ledges terminating in a La region having rounded edge along the opening sidewalls, the tip region being outwardly curved along its entirety;
charge-blocking dielectric within the cavities;
charge-storage structures within the opening and extending within the cavities, the charge-storage structures having continuous curved outer peripheries;
dielectric material within the openings and extending along the charge-storage structures;
channel material within the openings along the dielectric material;
wherein the conductively-doped silicon levels comprise control gates; wherein the charge-blocking dielectric is between the control gates and the charge-storage structures; wherein the charge-storage structures have gate lengths $L_1$ and the control gates have gate lengths $L_2$; and wherein $L_1$ and $L_2$ differ by less than 10 nm; and
wherein the charge-blocking dielectric comprises a first region containing silicon dioxide, a second region containing silicon nitride, and a third region containing oxide; with the second region being between the first and third regions.

2. The integrated structure of claim 1 wherein the regions of the silicon dioxide levels not encompassed by the ledges have thicknesses within a range of from about 20 nm to about 40 nm, and wherein the ledges have thicknesses within a range of from about 10 nm to about 15 nm.

3. The integrated structure of claim 1 wherein the ledges have thicknesses reduced relative to the regions of the silicon dioxide levels not encompassed by the ledges by an amount within a range of from about 10% to about 50%.

4. The integrated structure of claim 1 wherein the regions of the silicon dioxide levels not encompassed by the ledges have thicknesses within a range of from about 20 nm to about 40 nm, and wherein the ledges having thicknesses reduced relative to the regions of the silicon dioxide levels not encompassed by the ledges by an amount within a range of from about 10% to about 50%.

5. The integrated structure of claim 1 wherein the first region of the charge-blocking dielectric is entirely contained within the cavities, and wherein the second region of the charge-blocking dielectric wraps around the ledges as well as extending into the cavities.

6. The integrated structure of claim 5 wherein top and bottom surfaces of the ledges are vertically inset relative to top and bottom surfaces of the regions not encompassed by the ledges by an amount within a range of from about 2 nm to about 7 nm; and wherein the second region of the charge-blocking dielectric has a thickness within a range of from about 2 nm to about 7 nm.

7. The integrated structure of claim 6 wherein the charge-storage structures comprise silicon.

8. The integrated structure of claim 6 wherein $L_1$ and $L_2$ differ by less than 5 nm.

9. An integrated structure, comprising:
a stack of alternating silicon dioxide levels and conductive levels;
an opening extending through the stack, the opening having sidewalls along the silicon dioxide levels;
edges of the conductive levels being laterally recessed relative to the sidewalls of the opening to define cavities located between the silicon dioxide levels; the cavities extending from the sidewalls of the opening into the conductive levels;
regions of the silicon dioxide levels over and under the cavities being ledges of the silicon dioxide levels separating adjacent cavities from one another; the ledges being thinned relative to regions of the silicon dioxide levels not encompassed by the ledges, each of the ledges terminating in a La region having a convexly rounded edge along the sidewalls of the opening, the rounded edge extending between an upper surface of the ledge and a bottom surface of the ledge and being convexly curved along its entirety;
charge-blocking dielectric within the cavities;

charge-storage structures within the openings and extending within the cavities, the charge-storage structures having continuous curved outer peripheries;
dielectric material within the openings and extending along the charge-storage structures;
channel material along the dielectric material;
wherein the conductive levels comprise control gates; wherein the charge-blocking dielectric is between the control gates and the charge-storage structures; wherein the charge-storage structures have gate lengths $L_1$ and the control gates have gate lengths $L_2$; and wherein $L_1$ and $L_2$ differ by less than 10 nm; and
wherein the charge-blocking dielectric comprises a first region containing silicon dioxide, a second region containing silicon nitride, and a third region containing oxide; with the second region being between the first and third regions.

* * * * *

UNITED STATES PATENT AND TRADEMARK OFFICE
CERTIFICATE OF CORRECTION

PATENT NO. : 10,672,785 B2
APPLICATION NO. : 14/679926
DATED : June 2, 2020
INVENTOR(S) : Fatma Arzum Simsek-Ege, Meng-Wei Kuo and John D. Hopkins Page 1 of 1

It is certified that error appears in the above-identified patent and that said Letters Patent is hereby corrected as shown below:

In the Claims

Column 7, Line 59 in Claim 1 – Replace "in a La region" with --in a tip region--

Column 7, Line 60 in Claim 1 – Replace "edge along the" with --edges along the--

Column 8, Line 62 in Claim 9 – Replace "in a La region" with --in a tip region--

Signed and Sealed this
Eighth Day of September, 2020

Andrei Iancu
*Director of the United States Patent and Trademark Office*